United States Patent
Yin et al.

(10) Patent No.: US 10,635,526 B2
(45) Date of Patent: Apr. 28, 2020

(54) MULTICORE ON-DIE MEMORY MICROCONTROLLER

(71) Applicant: SanDisk Technologies LLC, Plano, TX (US)

(72) Inventors: Yibo Yin, Sunnyvale, CA (US); Henry Zhang, Saratoga, CA (US); Po-Shen Lai, San Jose, CA (US); Vijay Chinchole, Bangalore (IN); Spyridon Georgakis, San Francisco, CA (US); Yan Li, Milpitas, CA (US); Hiroyuki Mizukoshi, Kawasaki (JP); Toru Miwa, Yokohama (JP); Jayesh Pakhale, San Jose, CA (US); Tz-Yi Liu, Palo Alto, CA (US)

(73) Assignee: SanDisk Technologies LLC, Addison, TX (US)

( * ) Notice: Subject to any disclaimer, the term of this patent is extended or adjusted under 35 U.S.C. 154(b) by 130 days.

(21) Appl. No.: 15/934,565

(22) Filed: Mar. 23, 2018

(65) Prior Publication Data

US 2018/0357123 A1 Dec. 13, 2018

Related U.S. Application Data

(60) Provisional application No. 62/518,584, filed on Jun. 12, 2017.

(30) Foreign Application Priority Data

Jul. 7, 2018 (IN) .............................. 201841008353

(51) Int. Cl.
G06F 11/10 (2006.01)
G11C 29/16 (2006.01)
(Continued)

(52) U.S. Cl.
CPC ........ G06F 11/1016 (2013.01); G06F 9/3004 (2013.01); G06F 9/30087 (2013.01);
(Continued)

(58) Field of Classification Search
CPC ............. G06F 11/1064; G06F 11/1016; G06F 11/1004; G06F 11/0721; G06F 11/277;
(Continued)

(56) References Cited

U.S. PATENT DOCUMENTS 5,509,134 A 4/1996 Fandrich et al.
6,545,891 B1 4/2003 Tringali et al.
(Continued)

OTHER PUBLICATIONS

PCT Application PCT/US18/24103 (2380.2.318) Partial International Search dated Jun. 13, 2018.

*Primary Examiner* — Nadeem Iqbal
(74) *Attorney, Agent, or Firm* — Vierra Magen Marcus LLP

(57) ABSTRACT

Apparatuses, systems, methods, and computer program products are disclosed for a multicore on-die memory controller. An integrated circuit device includes an array of non-volatile memory cells and a microcontroller unit. A microcontroller unit includes a plurality of processing units. Different processing units perform different categories of tasks in parallel for an array of non-volatile memory cells.

23 Claims, 8 Drawing Sheets

(51) Int. Cl.
*G06F 9/30* (2018.01)
*G06F 15/78* (2006.01)
*G06F 9/38* (2018.01)
*G06F 9/46* (2006.01)

(52) U.S. Cl.
CPC .............. *G06F 9/3836* (2013.01); *G06F 9/46* (2013.01); *G06F 11/1064* (2013.01); *G06F 15/785* (2013.01); *G11C 29/16* (2013.01)

(58) Field of Classification Search
CPC ............. G06F 11/0727; G06F 11/3452; G06F 11/3485; G06F 11/3636
See application file for complete search history.

(56) References Cited

U.S. PATENT DOCUMENTS

| | | |
|---|---|---|
| 6,754,765 B1 | 6/2004 | Chang et al. |
| 6,765,813 B2 | 7/2004 | Scheuerlein et al. |
| 6,772,276 B2 | 8/2004 | Dover |
| 7,574,611 B2 | 8/2009 | Cohen |
| 7,600,090 B2 | 10/2009 | Cohen et al. |
| 7,944,765 B1 * | 5/2011 | Han ............... G01R 31/318519 365/185.09 |
| 8,327,161 B2 | 12/2012 | Cohen |
| 8,843,731 B2 | 9/2014 | Bueb et al. |
| 8,856,602 B2 * | 10/2014 | Brown ........... G01R 31/318566 714/726 |
| 9,268,542 B1 | 2/2016 | Mars et al. |
| 9,558,846 B1 * | 1/2017 | Nafziger ................ G11C 29/12 |
| 2008/0049514 A1 * | 2/2008 | Mondello .............. G11C 29/16 365/185.22 |
| 2010/0122097 A1 | 5/2010 | Cohen |
| 2011/0161586 A1 | 6/2011 | Potknojak et al. |
| 2015/0127927 A1 * | 5/2015 | Paddon ............... G06F 9/30043 712/225 |
| 2016/0371226 A1 * | 12/2016 | Shalf ................... G06F 12/0813 |
| 2018/0081774 A1 * | 3/2018 | Kawamura ............ G06F 11/14 |

* cited by examiner

MULTICORE ON-DIE MEMORY MICROCONTROLLER

CROSS-REFERENCES TO RELATED APPLICATIONS

This application claims the benefit of U.S. Provisional Patent Application No. 62/518,584 entitled "MULTICORE ON-DIE MEMORY MICROCONTROLLER" and filed on Jun. 12, 2017 for Yibo Yin and of Indian Provisional Patent Application Number 201841008353 entitled "MULTICORE ON-DIE MEMORY MICROCONTROLLER" and filed on Mar. 7, 2018 for Yibo Yin et al., which are both incorporated herein by reference in their entirety, for all purposes.

TECHNICAL FIELD

The present disclosure, in various embodiments, relates to non-volatile and/or volatile memory and more particularly relates to an on-die memory microcontroller for non-volatile and/or volatile memory.

BACKGROUND

A memory device may have a state machine that controls certain operations of the memory device. However, once the state machine is "taped-out" and in production, minimal if any changes can be made to address errors or design defects, limiting development and testing flexibility without greatly extending the design cycle.

SUMMARY

Apparatuses, systems, methods, and computer program products are disclosed for a multicore on-die memory controller. In one embodiment, an apparatus includes an array of non-volatile memory cells in an integrated circuit device. An apparatus, in a further embodiment, includes a microcontroller unit in an integrated circuit device. In certain embodiments, an apparatus includes a plurality of processing units of a microcontroller unit. Different processing units, in some embodiments, perform different categories of tasks in parallel for an array of non-volatile memory cells.

A system, in one embodiment, includes an integrated circuit device including multiple levels each comprising one or more layers. A first level of an integrated circuit device, in certain embodiments, includes a non-volatile memory medium. In a further embodiment, a second level of an integrated circuit device is parallel to and offset from a first level. A second level of an integrated circuit device, in one embodiment, includes a microcontroller with a plurality of processing units. Different processing units, in various embodiments, perform different types of tasks in parallel for a non-volatile memory medium.

Another apparatus, in certain embodiments, includes means for storing data. In one embodiment, an apparatus includes means for sorting tasks for a means for storing data by category of task. An apparatus, in some embodiments, includes means for performing different categories of tasks for a means for storing data in parallel using different processing units for the means for storing data.

A method, in one embodiment, includes receiving a request for a memory operation. In certain embodiments, a method includes determining a plurality tasks for completing a memory operation. Different tasks of a plurality of tasks, in one embodiment, are associated with different instruction sets. A method, in some embodiments, includes performing different tasks of a plurality of tasks in parallel using different processing units of a microcontroller. Different processing units, in one embodiment, support different instruction sets.

A further apparatus, in some embodiments, includes a microcontroller for a memory array of an integrated circuit device. A microcontroller, in one embodiment, is configured to select a plurality of tasks for a memory operation using a first processing unit. A microcontroller, in a further embodiment, is configured to control timing of a plurality of tasks for a memory operation using a second processing unit. In certain embodiments, a microcontroller is configured to set voltages for a plurality of tasks for a memory operation using a third processing unit.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
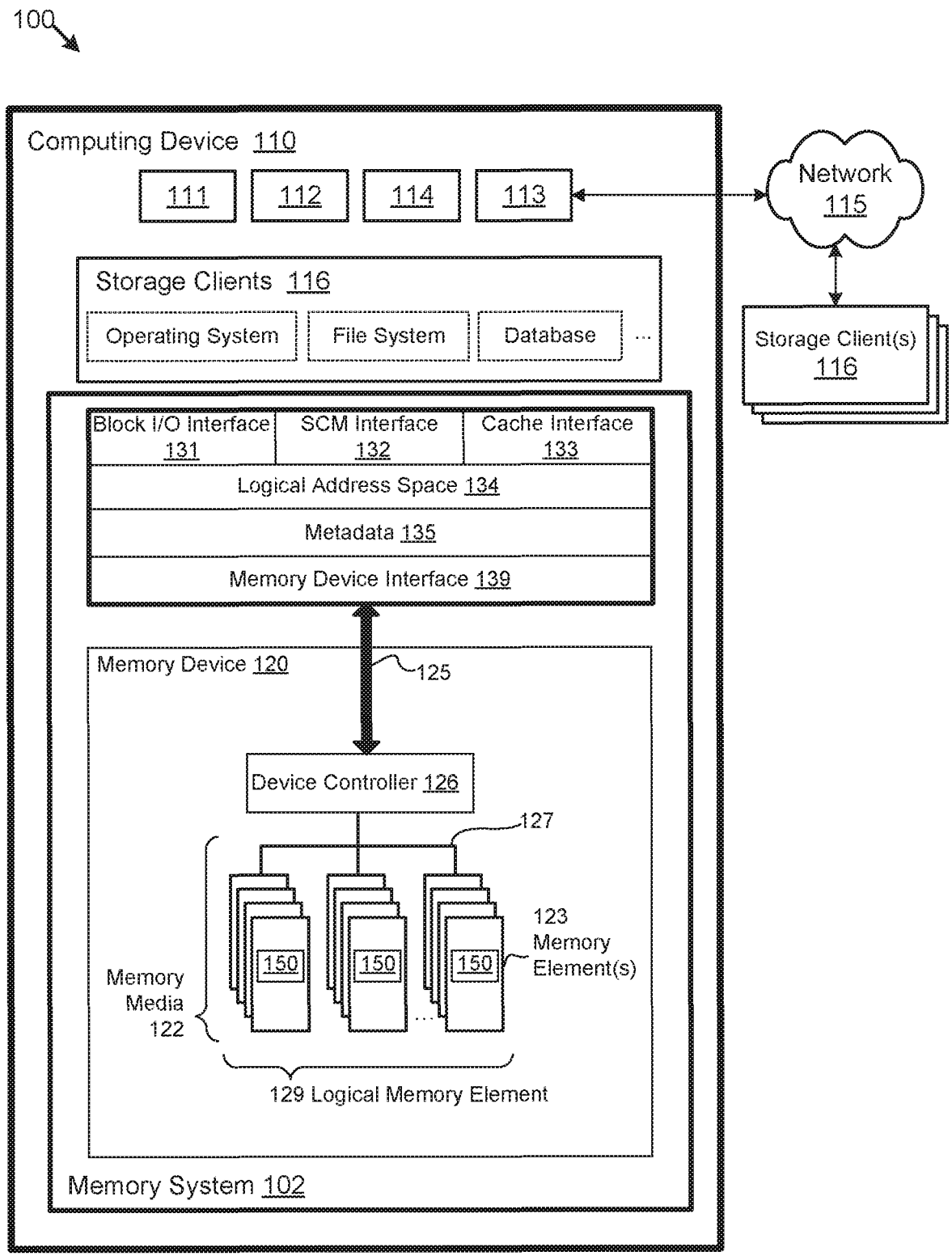
FIG. 1 is a schematic block diagram illustrating one embodiment of a system for an on-die memory microcontroller.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 for an on-die memory microcontroller 150. The system 100 comprises one or more microcontrollers 150 for memory media 122 of a non-volatile and/or volatile memory device 120. A microcontroller 150 may be part of a non-volatile and/or volatile memory element 123, and may be in communication with a non-volatile and/or volatile memory media controller 126, a device driver, or the like. In some embodiments, a microcontroller 150 may at least partially operate on and/or in communication with a non-volatile and/or volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or memory controller 126 to a communication network 115, such as an Internet Protocol (IP) network, a Storage Area Network (SAN), wireless network, wired network, or the like.

A microcontroller 150, as used herein, comprises one or more circuits or other logic hardware of an integrated circuit device, such as a die and/or chip 123 of memory media 122 (e.g., a memory element 123 or other integrated circuit device). For example, in one embodiment, a microcontroller 150 may comprise synthesizable logic (e.g., defined in a hardware description language such as Verilog, VHSIC hardware description language (VHDL), or the like; a gate-level netlist; a soft core; and/or another logic design) placed and/or routed onto a programmable logic device such as a field programmable gate array (FPGA), manufactured as an application specific integrated circuit (ASIC) device; and/or another integrated circuit device 123. In a further embodiment, a microcontroller 150 may comprise analog and/or mixed-signal logic (e.g., defined and/or designed in a transistor-layout format, an ASIC, discrete logic components, a hard core, and/or another integrated circuit device 123).

A microcontroller 150 may perform and/or control one or more tasks for a memory element 123 of memory media 122, such as management functions or the like. A microcontroller 150 may comprise one or more processing units, processing cores, or the like that process and/or execute microcode or other computer executable code (e.g., an instruction set) to perform tasks or operations. In this manner, instead of or in addition to manufacturing a new integrated circuit device or upgrading firmware, one or more functions and/or tasks of a microcontroller 150 may be updated by changing and/or updating microcode or other computer executable code of the microcontroller 150. A microcontroller 150 may comprise volatile and/or non-volatile memory or storage, which the microcontroller 150 may use to store microcode, to store data for and/or from an array of memory media 122, to store settings and/or configuration parameters, or the like.

In certain embodiments, the memory device 120 and/or the memory elements 123 may be used in a variety of applications and/or environments. In order to properly function in various temperatures and other environmental conditions, a clock rate of a microcontroller 150 and/or of a memory element 123 may be set artificially low, to improve stability, reliability, or the like in a wide range of operating conditions. For example, in various embodiments, a clock rate for a microcontroller 150 may be set less than about 50 MHz, less than about 40 MHz, less than about 30 MHz, less than about 20 MHz, less than about 15 MHz, about 14 MHz, about 13.5 MHz, about 13 MHz, about 12.5 MHz, about 12 MHz, less than about 12 MHz, or the like.

However, such a low clock rate for a microcontroller 150, in certain embodiments, may be set lower than a clock rate at which the microcontroller 150 can perform data operations for the memory media 122 using a single processing unit without increasing a latency of the data operations (e.g., a single processing unit or core may not be fast enough at the clock rate or frequency to read data from and/or write data to the non-volatile memory medium 123 without slowing down the read and/or write operations, causing the microcontroller 150 to become a bottleneck, or the like). A microcontroller 150, in one embodiment, may include, be associated with, and/or have access to a plurality of processing units and/or cores that perform different categories and/or portions of tasks for an array of memory media 122 in parallel (e.g., to reduce and/or eliminate an effect of a slow microcontroller clock rate on access latency for the memory media 122, or the like).

A processing unit, as used herein, comprises a sub-block and/or component associated with one or more microcontrollers 150 and capable of executing and/or processing one or more commands and/or instructions (e.g., microcode, an instruction set, or the like). A processing unit may be part of a microcontroller 150, may be shared by multiple microcontrollers 150, or the like. A processing unit may comprise a processing core, a soft core, a hard core, synthesizable logic, analog and/or mixed signal logic, an execution unit, a module, a sub-component, and/or other part of a microcontroller 150 capable of executing an instruction. In one embodiment, different processing units may have separate logical and/or physical interfaces, (e.g., busses, control lines, addresses and/or address spaces, or the like) in order to independently receive commands and/or instructions. In other embodiments, different processing units may share a logical and/or physical interface, and may dynamically distinguish received commands and/or instructions by category, command type, instruction set, flag, identifier, or the like.

Different processing units and/or cores of a microcontroller 150 may support different instruction sets (e.g., different microcode commands and/or instructions), based on the categories and/or types of tasks assigned to the different processing units and/or cores. An instruction set for a processing unit, as used herein, may comprise one or more commands and/or instructions supported by and/or compatible with the processing unit. In various embodiments, an instruction set may include and/or support one or more microcode instructions, assembly code instructions, machine instructions, memory instructions, device instructions, control and/or management instructions, or the like.

In one embodiment, one or more processing units may perform a flow control category of tasks (e.g., a flow control instruction set). One or more processing units, in certain embodiments, may perform a timing control category of tasks (e.g., a timing control instruction set). One or more processing units, in a further embodiment, may perform a data latch control category of tasks (e.g., a data latch control instruction set). In one embodiment, one or more processing units may perform a voltage control category of tasks (e.g., a voltage control instruction set). One or more processing units, in certain embodiments, may perform a built-in self-test (BIST) category of tasks (e.g., a self-test instruction set). In one embodiment, one or more processing units may perform one or more other types and/or categories of tasks, instruction sets, or the like. Two instruction sets may be different, in certain embodiments, in response to at least one instruction and/or command included in one instruction set not being included in another instruction set. A microcontroller 150, in one embodiment, comprises and/or supports an instruction set comprising a combined sum and/or total of the different instruction sets supported by the processing units associated with and/or available to the microcontroller 150.

Figure 2:
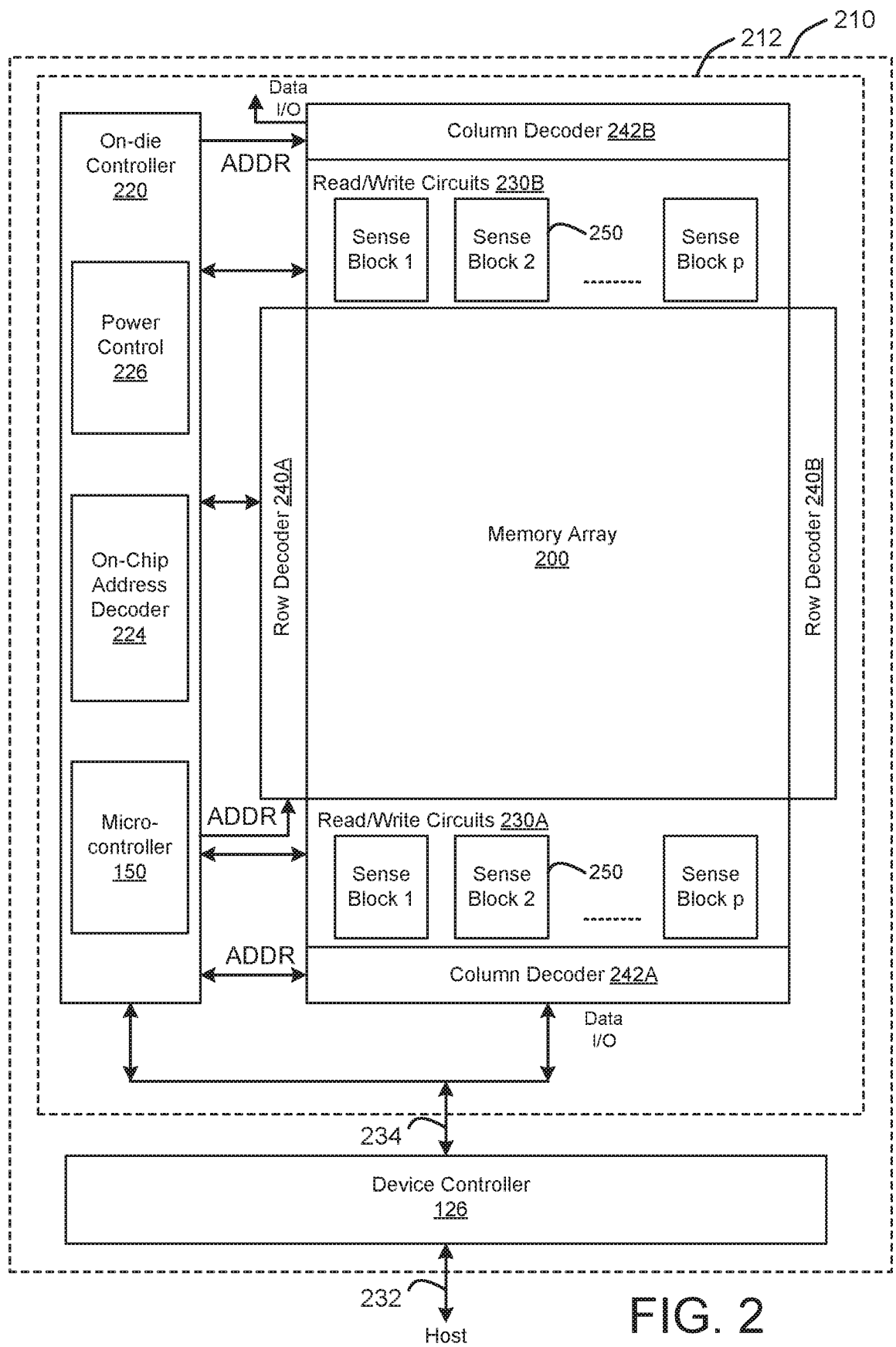
FIG. 2 is a schematic block diagram illustrating another embodiment of a system for an on-die memory microcontroller.

In one embodiment, a microcontroller 150 may be disposed at or toward an edge and/or peripheral of a memory element 123, adjacent and/or next to an array of memory media 122 (e.g., as depicted in FIG. 2). In a further embodiment, a microcontroller 150 may be disposed on a different level, layer, and/or plane of an integrated circuit device 123 than an array of memory media 122 (e.g., as CMOS or other circuit under the array, parallel with and offset from the array, or the like). Forming and/or placing a microcontroller 150 on a different level of an integrated circuit device 123 than an array of memory media 122, in certain embodiments, may conserve space of the integrated circuit device 123, allowing more circuits (e.g., more or larger microcontrollers 150 and/or microcontroller cores 150, processing units, a larger array of memory media 122, or the like), a smaller integrated circuit device 123, or the like. In certain embodiments, through-silicon vias (e.g., TSVs) between different levels of an integrated circuit device 123 may provide electrical connections between one or more microcontrollers 150 and an array of memory media 122.

In certain embodiments, an integrated circuit device 123 may comprise one or more additional microcontrollers 150, microcontroller cores 150, or the like. Different microcontrollers 150 and/or microcontroller cores 150 may be on the same level and/or layer as each other (e.g., a different level and/or layer than a memory array, parallel to and offset from a level of the memory array, or the like), may be on multiple different levels and/or layers (e.g., multiple different levels and/or layers than the memory array, parallel to and offset from a level of the memory array and from each other, or the like), may be on one or more same levels and/or layers as a memory array, or the like.

In one embodiment, to conserve space of an integrated circuit device 123, one or more additional microcontrollers 150 and/or microcontroller cores 150 may comprise fewer processing units, may comprise processing units configured to perform fewer types and/or categories of tasks, or the like than a first microcontroller 150 and/or microcontroller core 150 (e.g., a primary, main, control, full, and/or complete microcontroller core 150 with one or more secondary, partial, smaller, and/or reduced microcontroller cores 150 comprising fewer processing units, or the like).

For example, a first microcontroller 150 and/or microcontroller core 150 may comprise and/or be in communication with a built-in self-test processing unit configured to perform self-test operations on an array of memory media 122, while one or more additional microcontrollers 150 and/or microcontroller cores 150 may have no built-in self-test processing unit. In a further embodiment, a first microcontroller 150 and/or microcontroller core 150 is configured to perform both program/write and read operations on a memory array, while one or more additional microcontrollers 150 and/or microcontroller cores 150 may be configured to perform read operations, but not program/write operations on the memory array (e.g., and may have a smaller footprint and/or size than the first microcontroller 150).

In certain embodiments, a first set of one or more microcontrollers 150 (e.g., primary, main, control, full, and/or complete microcontroller cores 150, or the like) may perform program/write operations for an entire array of memory media 122 (e.g., each channel, subset, and/or region of memory cells of an integrated circuit device 123) while both the first set of one or more microcontrollers 150 and a second set of one or more microcontrollers 150 (e.g., one or more secondary, partial, smaller, and/or reduced microcontroller cores 150 comprising fewer processing units, or the like) may perform read operations for different parts of the array of memory media 122 (e.g., being assigned to different channels, subsets, and/or regions of memory cells of an integrated circuit device 123).

The memory device 120, in various embodiments, may be disposed in one or more different locations relative to the computing device 110. In one embodiment, the memory device 120 comprises one or more non-volatile and/or volatile memory elements 123, such as semiconductor chips or packages or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the microcontroller 150 may include one or more computer readable instructions stored on the non-transitory storage medium 114.

In one embodiment, a microcontroller 150 may comprise logic hardware of a non-volatile and/or volatile memory element 123, other programmable logic, firmware for a non-volatile and/or volatile memory element 123, microcode for execution by a non-volatile and/or volatile memory element 123, or the like. In another embodiment, a microcontroller 150 may at least partially comprise executable software code (e.g., microcode), stored on a computer readable storage medium for execution by logic hardware of a non-volatile and/or volatile memory element 123 (e.g., for execution by the microcontroller 150 itself, by the processor 111, or the like). In a further embodiment, a microcontroller 150 may include a combination of both executable software code and logic hardware.

In one embodiment, the microcontroller 150 is configured to receive requests and/or commands from a device driver or other executable application via buses 125, 127, a memory media controller 126, or the like. The microcontroller 150 may be further configured to transfer data to/from a device driver and/or storage clients 116 via the bus 125. Accordingly, the microcontroller 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the microcontroller 150 may receive storage requests and/or refresh commands as an API call from a storage client 116, as an IO-CTL command, or the like.

In one embodiment, a microcontroller 150 is integrated on a memory element 123 (e.g., an on-die controller and/or other logic hardware or executable code) and receives commands from a device controller 126, a host device 110, and/or a processor 111. In other embodiments, a portion of a microcontroller 150 may be disposed on a device controller 126 or other interposer and a portion of a microcontroller 150 may be disposed on a memory element 123, or the like.

According to various embodiments, a memory controller 126 and/or a microcontroller 150 may manage one or more memory devices 120 and/or memory elements 123. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units and/or regions may include, but are not limited to: pages, memory divisions, blocks, sectors, collections or sets of physical storage locations (e.g., logical pages, logical blocks), or the like.

A device driver, the memory media controller 126, and/or a microcontroller 150, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the memory device 120 may maintain metadata 135, such as a logical to physical address mapping structure, to map logical addresses of the logical address space 134 to media storage locations on the memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more memory devices 120. The one or more memory devices 120 may include different types of memory devices including, but not limited to: solid-state storage devices, semiconductor storage devices, SAN storage resources, volatile memory devices, non-volatile memory devices, or the like. The one or more memory devices 120 may comprise one or more respective memory media controllers 126 and memory media 122. A device driver may provide access to the one or more memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the memory device 120. Also, in some embodiments, the SCM interface 132 presented to the storage clients 116 provides access to data transformations implemented by the one or more memory devices 120 and/or the one or more memory media controllers 126.

A device driver may present a logical address space 134 to the storage clients 116 through one or more interfaces. As discussed above, the logical address space 134 may comprise a plurality of logical addresses, each corresponding to respective media locations the on one or more memory devices 120. A device driver may maintain metadata 135 comprising any-to-any mappings between logical addresses and media locations, or the like.

A device driver may further comprise and/or be in communication with a memory device interface 139 configured to transfer data, commands, and/or queries to the one or more memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe- AS) bus, a network 115, Infiniband, SCSI RDMA, or the like. The memory device interface 139 may communicate with the one or more memory devices 120 using input-output control (IO-CTL) command(s), IO-CTL command extension(s), remote direct memory access, or the like.

The communication interface 113 may comprise one or more network interfaces configured to communicatively couple the computing device 110 and/or the memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The memory controller 126 is part of and/or in communication with one or more memory devices 120. Although FIG. 1 depicts a single memory device 120, the disclosure is not limited in this regard and could be adapted to incorporate any number of memory devices 120, a combination of one or more volatile memory devices 120 and one or more non-volatile memory devices 120, or the like.

The memory device 120 may comprise one or more elements 123 of memory media 122. In one embodiment, an element 123 of memory media 122 comprises a volatile memory medium 122, such as random access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 123 of memory media 122 comprises a non-volatile memory medium 122, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. The one or more elements 123 of memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 (e.g., to the microcontroller 150) by way of a bus 127. The bus 127 may comprise an I/O bus for communicating data to/from the non-volatile memory elements 123 and/or the associated microcontrollers 150. The bus 127 may further comprise a control bus for communicating addressing and other command and control information to the non-volatile memory elements 123 and/or the microcontrollers 150. In some embodiments, the bus 127 may communicatively couple the non-volatile memory elements 123 (e.g., the microcontrollers 150) to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 and/or a microcontroller 150 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102. A device driver may further comprise a non-volatile memory device interface 139 that is configured to transfer data, commands, and/or queries to the non-volatile memory media controller 126 and/or a microcontroller 150 over a bus 125, as described above.

Figure 7:
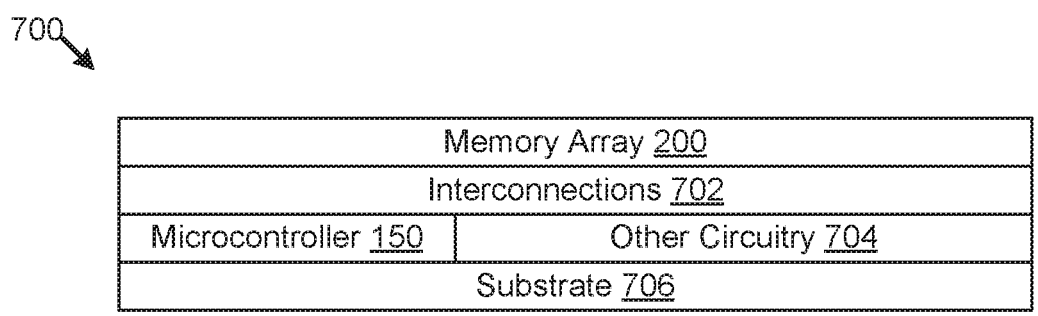
FIG. 7 is a schematic block diagram illustrating one embodiment of an integrated circuit device with an on-die memory microcontroller.

FIG. 2 illustrates an embodiment of a non-volatile storage device 210 that may include one or more memory die or chips 212, with one or more microcontrollers 150. The nonvolatile storage device 210 may be substantially similar to the nonvolatile memory device 120 described with reference to FIG. 1. While the one or more microcontrollers 150 of FIG. 2 are depicted toward a periphery of the memory die and/or chip 212 (e.g., on a same physical level as the memory array 200 in an integrated circuit device 123), in other embodiments, one or more microcontrollers 150 may be disposed on a different physical level of the memory die and/or chip 212 than the memory array 200 (e.g., parallel to and offset from a level of the memory array 200 in an integrated circuit device 123), as depicted in FIG. 7.

The memory die 212, in some embodiments, includes an array 200 (e.g., two-dimensional or three dimensional) of memory cells, an on-die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel. In certain embodiments, the sense blocks 250 are in communication with the one or more microcontrollers 150.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

On-die controller 220, in one embodiment, cooperates with the read/write circuits 230A/230B to perform memory operations on the memory array 200. The on-die controller 220, in certain embodiments, includes a microcontroller 150, an on-chip address decoder 224, and a power control circuit 226. In one embodiment, the on-chip address decoder 224 and/or the power control circuit 226 may be part of and/or controlled by the micro-controller 150.

The microcontroller 150, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In one embodiment, one or any combination of on-die controller 220, microcontroller 150, power control circuit 226, decoder circuit 224, decoder circuit 242A, decoder circuit 242B, decoder circuit 240A, decoder circuit 240B, read/write circuits 230A, read/write circuits 230B, and/or controller 244 can be referred to as one or more managing circuits.

Figure 3:
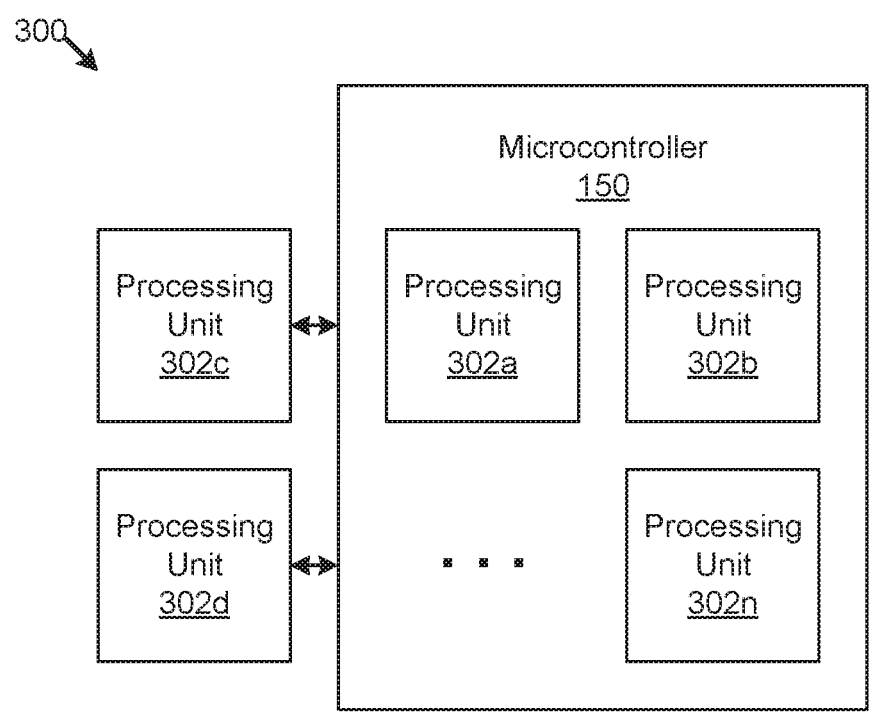
FIG. 3 is a schematic block diagram illustrating one embodiment of an on-die memory microcontroller.

FIG. 3 depicts one embodiment of a system 300 with an on-die memory microcontroller unit 150. The microcontroller 150 of FIG. 3, in certain embodiments, may be substantially similar to the microcontroller 150 of FIG. 1 and/or the microcontroller 150 of FIG. 2.

In the depicted embodiment, the microcontroller 150 comprises and/or is in communication with a plurality of processing units 302a-n. Some processing units 302a, 302b, 302n are internal to and/or part of the microcontroller 150, while other processing units 302c, 302d are external to the microcontroller 150 (e.g., external processing units, functional units, or the like) and are in communication with the microcontroller 150 (e.g., and may be in communication with one or more additional microcontrollers 150 and/or microcontroller cores 150). In certain embodiments, the processing units 302c, 302d, external to the microcontroller 150 may be disposed in the same level (e.g., one or more layers, planes, or the like) as the microcontroller 150 within an integrated circuit device 123 (e.g., under a memory array 200, or the like).

The processing units 302a-n, in various embodiments, may comprise one or more of a read processing unit 302, a program/write processing unit 302, a built-in self-test processing unit 302, a flow control processing unit 302, a timing control processing unit 302, a voltage control processing unit 302, and/or a data latch control processing unit 302, or the like. The processing units 302a-n may perform different categories of tasks, such as flow control tasks, timing control tasks, data latch control tasks, voltage control tasks, and/or built-in self-test tasks, or the like.

In certain embodiments, using a microcontroller 150 (e.g., instead of and/or in addition to a finite state machine, or the like), may allow dynamic updates and/or changes to timing, voltages, logic operations, instructions, commands, microcode, or the like for the microcontroller 150, even after hardware of the microcontroller 150 and/or associated integrated circuit device 123 has been finalized and/or manufactured, in the field, or the like, without changing the hardware. The multiple processing units 302a-n, in one embodiment, operating in parallel (e.g., multithreaded), may allow the microcontroller 150 to operate at a lower clock speed than would otherwise be possible without also increasing a latency of memory operations (e.g., read, program/write, erase) on the memory array 200.

Each processing unit 302, in certain embodiments, comprises a read port which the processing unit 302 may use to access instructions/commands and/or data from a volatile memory module (e.g., the volatile memory modules 406 described below with regard to FIG. 4, or the like). Communications between processing units 302₁-n may occur over a standard interface (e.g., the same protocol for different types of processing units 302a-n) that transfers both commands and data. In one embodiment, the same interface may be used for processing units 302a, 302b, 302n within a microcontroller 150 and for processing units 302c, 302d outside of the microcontroller 150.

Figure 4:
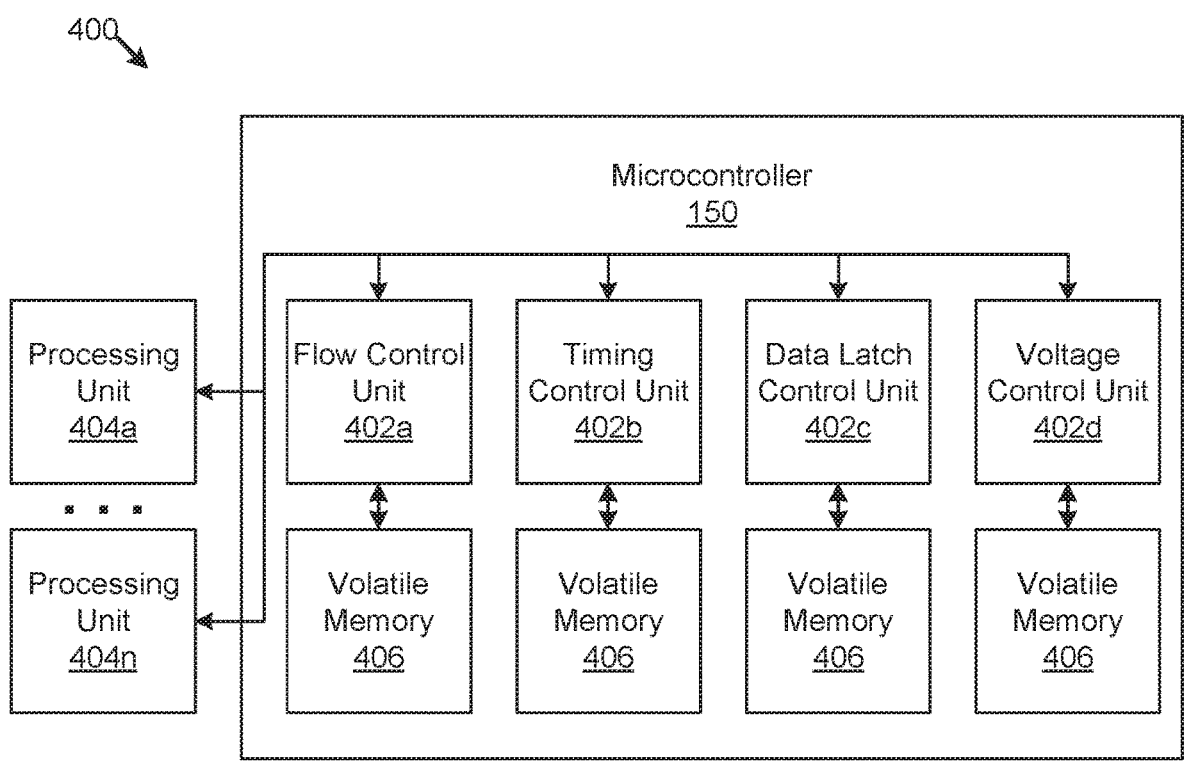
FIG. 4 is a schematic block diagram illustrating a further embodiment of an on-die memory microcontroller.

FIG. 4 depicts one embodiment of a system 400 with an on-die memory microcontroller 150. The microcontroller 150, in certain embodiments, may be substantially similar to one or more of the microcontroller 150 of FIG. 1, the microcontroller 150 of FIG. 2, and/or the microcontroller 150 of FIG. 3, described above. In the depicted embodiment, the microcontroller 150 comprises a flow control processing unit 402a, a timing control processing unit 402b, a data latch control processing unit 402c, and a voltage control processing unit 402d, each in communication with volatile memory 406 and with one or more external processing units 404a-n, external to the microcontroller 150.

A flow control processing unit 402a, in certain embodiments, may control and/or track execution of one or more memory operations (e.g., read operations, write/program operations, erase operations, management operations such as garbage collection operations, or the like) for a memory array 200. For example, a flow control processing unit 402a may direct a series of states for different memory operations, managing one or more other processing units 402 (e.g., a timing control unit 402b, a data latch control unit 402c, a voltage control unit 402d, one or more external processing units 404a-n, or the like) to execute the different memory operations, sending them commands/instructions, determining a state of the other processing units 402, 404 during the different memory operations, or the like. A flow control processing unit 402a, in one embodiment, may manage a datapath for memory operations (e.g., between a device controller 126 and a memory array 200, between a microcontroller 150 and a memory array 200, or the like). A flow control processing unit 402a, in some embodiments, may manage one or more internal data busses of a microcontroller 150, of an integrated circuit device 123 comprising the microcontroller 150, or the like.

A flow control processing unit 402a, in one embodiment, may comprise or otherwise include a read processing unit configured to execute and/or manage (e.g., in parallel with one or more other processing units 402a-n, 404a-n) a subroutine of microcode, assembly code, and/or other computer executable code to read data from a memory array 200 and provide the read data to a device controller 126, a host device 110, a storage client 116, or the like (e.g., in response to a read request from the device controller 126, the host device 110, the storage client 116, or the like).

A flow control processing unit 402a, in one embodiment, may comprise or otherwise include a write/program processing unit configured to execute and/or manage (e.g., in parallel with one or more other processing units 402a-n, 404a-n) a subroutine of microcode, assembly code, and/or other computer executable code to write/program data to a memory array 200, in response to a write request from a device controller 126, a host device 110, a storage client 116, or the like). As described below with regard to FIG. 6, in certain embodiments, a first microcontroller 150a may comprise a flow control processing unit 402a with a write/program processing unit and a read processing unit, while one or more other microcontrollers 150b-n comprise a read processing unit without a write/program processing unit (e.g., to conserve power, circuit size/space, or the like).

In one embodiment, a flow control processing unit 402a comprises a built-in self-test processing unit. As described below with regard to FIG. 6, in certain embodiments, a first one or more microcontrollers 150a comprise a built-in self-test processing unit for an integrated circuit device 123 and/or memory array 200, while one or more other microcontrollers 150b-n do not comprise a built-in self-test processing unit (e.g., to conserve power, circuit size/space, or the like).

In one embodiment, in a multiple microcontroller 150 system, one or more reduced size microcontrollers 150, without built-in self-test processing units, may be idle during die sort or other testing, validation, and/or verification process performed by a built-in self-test processing unit of a primary or full size microcontroller 150 of the same integrated circuit device 123. With one or more reduced size microcontrollers 150 unused, at least a portion of the volatile memory 406 associated with the idle microcontrollers 150 may also be unused, and available. In certain embodiments, a flow control processing unit 402a may leverage the available excess capacity of the volatile memory 406 of one or more idle microcontrollers 150 during a test performed by a built-in self-test processing unit of the flow control processing unit 402a to store and process data read out from the memory array 200 for the test.

The flow control processing unit 402a may stream test data from the memory array 200 to the volatile memory 406, where the built-in self-test unit may process the data for errors, or the like. A built-in self-test processing unit of a flow control processing unit 402a may carry out one or more data transfers, data processing, timer functions, or the like to test one or more functions of an integrated circuit device 123 and/or memory array 120 (e.g., to identify and mark one or more bad bit lines, bad word lines, bad erase blocks; to generate one or more test and/or error reports for a tester, a host device 110, a storage client 116, or the like).

In one embodiment, a flow control processing unit 402a may comprise one or more interrupt ports (e.g., soft or logical interrupt ports, hard physical or electrical interrupt ports, or the like), over which the flow control processing unit 402a may receive one or more signals (e.g., operation mode select signals, feedback signals, program and/or erase pulse counts, program and/or erase verify pass or fail signals, and/or other interrupts or other signals enabling the flow control processing unit 402a to manage one or more memory operations for the microcontroller 150).

In certain embodiments, a flow control processing unit 402a may provide a status (e.g., ready, busy, or the like) of the microcontroller 150 to a device controller 126, a host device 110, a storage client 116, or the like, and may receive one or more commands and/or operations for the microcontroller 150 and/or the memory array 200. The flow control processing unit 402a may use the one or more interrupt ports to respond quickly (e.g., substantially immediately) to a command, rather than periodically polling for a command and introducing latency and delay. A flow control processing unit 402a may select/determine a subroutine for execution by one or more processing units 402a-d, 404a-n of a microcontroller 150 based on signals on the one or more interrupt ports, a received command for an operation, or the like.

For example, in one embodiment, a flow control processing unit 402a may receive (e.g., from a device controller 126, a host device 110, a storage client 116, or the like) a command interrupt signal (e.g., a single bit, or the like), a command index (e.g., multiple bits indicating which predefined operation the command interrupt signal is calling), a command operation code or OPCODE (e.g., multiple bits indicting a type of the interrupt, such as a command interrupt, a suspend interrupt, a resume interrupt, a reset interrupt, or the like), and/or one or more other interrupt signals, based upon which the flow control processing unit 402a may select/determine a subroutine comprising one or more instructions for one or more processing units 402a-d, 404a-n of the microcontroller 150.

A flow control processing unit 402a, in certain embodiments, may respond to a hard interrupt request, may copy a received command index into a program counter of the microcontroller 150 (e.g., into the lower bits or another predefined location of the program counter), or the like. An instruction corresponding to the command index in the program counter may comprise an unconditional jump instruction that points to a target subroutine that executes the requested operation.

In one embodiment, a flow control processing unit 402a may manage one or more other processing units 402a-d, 404a-n to avoid a write after read hazard and/or one or more other hazards (e.g., read after write hazards, write after write hazards, structural hazards, control hazards, or the like). For example, a flow control processing unit 402a may use a single interrupt wait (SIW) instruction and/or a group interrupt wait (GIW) instruction as wait statements or the like, to proactively check and wait for a status outside of the flow control processing unit 402a (e.g., waiting for a soft/logical interrupt signal, a hard/physical interrupt signal, another predefined condition, or the like) to enforce an execution order to avoid a write after read hazard, another hazard, or the like.

In certain embodiments, a flow control processing unit 402a may manage an execution order for one or more other processing units 402a-d, 404a-n by using one or more interrupt wait instructions (e.g., SIW and/or GIW). For example, a flow control processing unit 402a may execute a first instruction sequence, execute a SIW and/or GIW command identifying an interrupt condition (e.g., an external signal or the like), wait for the interrupt condition, and execute a second instruction sequence in response to the interrupt condition being satisfied.

A GIW wait instruction, in one embodiment, is substantially similar to a SIW wait instruction, except that it causes the flow control processing unit 402a to wait for multiple interrupt signals in a predefined group (e.g., multiple interrupt signals physically grouped in hardware, or the like). In certain embodiments, a GIW wait instruction may be configurable to selectively use the binary operator AND or the binary operator OR among the selected multiple interrupt signals. For example, if an AND binary operator is selected, the GIW wait instruction will wait until it receives all of the selected multiple interrupt signals. If an OR binary operator is selected, the GIW wait instruction will wait until it receives any one of the selected multiple interrupt signals, after which the GIW wait instruction allows the flow control processing unit 402a to proceed.

In certain embodiments, if multiple target interrupt signals are not physically grouped, and a GIW wait instruction may therefore not be used for the multiple target interrupt signals, a flow control processing unit 402a may support a series of consecutive SIW instructions, which together may behave like a single GIW instruction, or the like.

In one embodiment, a flow control processing unit 402a acts as the command center of one or more other processing units 402b-d, 404a-n. A flow control processing unit 402a may send commands and/or data to other processing units 402b-d, 404a-n and monitor their status. This one-to-all communication pattern, in certain embodiments, may reduce microcode and design complexity. In one embodiment, to minimize an instruction memory space 406 used by the flow control processing unit 402a and/or to prevent the flow control processing unit 402a from becoming a performance bottleneck, the flow control processing unit 402a may control and track some tasks, but may invoke other tasks for one or more processing units 402b-d, 404a-n without monitoring and/or tracking an ongoing status.

To facilitate and/or simplify control by a flow control processing unit 402a, in certain embodiments, one or more other processing units 402b-d, 404a-n may have a substantially similar interface (e.g., a standard interface or the like). One or more different processing units 402a-d, 404a-n may have a standard interface, but may support a different instruction set for executing different categories and/or types of tasks.

While many tasks, (e.g., having complex algorithms and/or repetitive execution) may be controlled by processing units 402b-d, 404a-n through the flow control processing unit 402a's standard interface protocol, there may be other small and/or one-time-execution tasks for certain types of operations. In embodiments where there are many such small tasks, the flow control processing unit 402a may comprise an expanded and/or customizable interface to provide support for the tasks, for new tasks over time, for custom tasks, or the like.

For example, the flow control processing unit 402a may support one or more command tables in a control register array (e.g., 64 bits by 16 bits, or the like) of the microcontroller 150. A control register array, in certain embodiments, may be accessed by the flow control processing unit 402a's load (LOD) and/or store (STR) instructions. At least a portion of the control register array's space may be virtual, because the flow control processing unit 402a's design may only occupy a subset of the space (e.g., 5 of the 64 registers, or the like). The rest of the control register array may be relatively independent from the flow control processing unit 402a, for use by custom tasks, or the like. One or more registers in the control register array not reserved for the flow control processing unit 402a, in certain embodiments, may be store custom command tables to expand the microcontroller's functionality for executing small tasks, one-time tasks, new tasks over time, or the like.

In some embodiments, a one-to-all communication pattern may use back-and-forth signal/command pairs between the flow control processing unit 402a and the timing control processing unit 402b. which may control the pace of the microcontroller 150. An output of the timing control processing unit 402b may be delivered to one or more peripheral modules of the memory array 200 throughout a memory access operation, to control the timing of the memory access operation. If the flow control processing unit 402a remains the sole master module in the microcontroller 150, it may monitor the timing control processing unit 402b's progress for each step of a memory access operation on a memory array 200, using processing time and/or volatile memory 406 overhead to synchronize the flow control processing unit 402a and the timing control unit 402b, as the flow control processing unit 402a sends commands to the timing control unit 402b and receives feedback signals from the timing control processing unit 402b (e.g., through the flow control processing unit 402a's interrupt interface, or the like).

To improve parallelism of a microcontroller 150's processing units 402a-d, 404a-n and/or pipelines, to reduce a number of lines of microcode, save instruction/data memory space 406, or the like, one or more of the processing units 402a-d, 404a-n may comprise one or more buffer and/or output stages. While the flow control processing unit 402a may still be a master for the microcontroller 150, when enabled by the flow control processing unit 402a, the timing control processing unit 402b may become a proxy for the flow control processing unit 402a that triggers other processing units 402c-d, 404a-n in a timely manner for one or more memory operations on a memory array 200.

The timing control processing unit 402b may have a knowledge of the execution progress of the memory operation, as the timing control unit 402b may control the timing and/or pace of the entire microcontroller 150. The timing control processing unit 402b may have more available space (e.g., in volatile memory 406 associated with the timing control unit 402b) for expanding the timing control processing unit 402b's instruction set than the flow control processing unit 402a, which may be used to enable the timing control processing unit 402b to act as a proxy for the flow control processing unit 402a. For example, only a small portion of space in the timing control processing unit 402b's instruction encoding table may be filled with instruction identification code, arguments, and switches (e.g., enable/disable bits), leaving room in the timing control processing unit 402b instruction encoding table to include more arguments and switches.

In certain embodiments, excess capacity of the timing control processing unit 402b's instruction encoding table may store an array (e.g., an 8-bit array, or the like) defining triggers for the timing control processing unit 402b to use to trigger the other processing units 402c-d, 404a-n, or the like. For example, the flow control processing unit 402a may start and/or initiate the timing control processing unit 402b to run a subroutine. The timing control processing unit 402b may run as a background process (e.g., in parallel with the flow control processing unit 402a) to provide one or more triggers to the flow control processing unit 402a, the data latch control unit 402c, the voltage control processing unit 402d, one or more external processing units 404a-n, or the like.

The flow control processing unit 402a may send a preparation command to one or more other processing units 402b-d, 404a-n to prepare a next task, provide an update, prepare an output in a buffer, or the like. The flow control processing unit 402a, in various embodiments, may or may not wait for the timing control processing unit 402b's trigger for sending a next preparation command, depending on the associated task. The timing control processing unit 402b may trigger one or more other processing units 402a, 402c, 402d, 404a-n to copy a buffer value to an associated output stage, or the like (e.g., to complete a task, to trigger a next step of a task, or the like).

The flow control processing unit 402a may send an initialization command (e.g., start command, preparation command, or the like) to a processing unit 402b-d, 404a-n, and the timing control processing unit 402b may send triggers to initiate subsequent portions of a task to a processing unit 402c-d, 404a-n, may send feedback to the flow control processing unit 402a (e.g., through an interrupt port or other interrupt interface of the flow control processing unit 402a), or the like. A trigger signal from the timing control processing unit 402b may trigger another processing unit 402c-d, 404a-n to provide an output signal, value or the like (e.g., the data latch control processing unit 402c to load a value into a data latch, the voltage control processing unit 402d to provide an output voltage, or the like), to complete a task, as an intermediate step of a task, or the like.

For example, the voltage control processing unit 402d may convert binary and/or digital values from the microcontroller 150 to analog voltages for the memory array 200 (e.g., program voltages, erase voltages, read voltages, bias voltages, word line voltages, bit line voltages, inhibit voltages, or the like). The data latch control processing unit 402c, in certain embodiments, may control one or more data buffers for the memory array, logic circuits for the memory array 200 (e.g., YLOG logic circuits that control the sense amplifiers 250, read/write circuits 230, row decoders 240, or the like), and/or other circuits for a memory array 200 of an integrated circuit device 123.

In one embodiment, the data latch control processing unit 402c may decode data from a volatile memory 406 into a command index (e.g., decoding 32-bit and/or 64-bit SRAM data into one or more command indexes, or the like). The data latch control processing unit 402c, in certain embodiments, may translate decoded command indexes into one or more commands (e.g., YLOG commands) using hardcoded combination logic and/or other rules. The data latch control processing unit 402c may buffer a predetermined number of commands each clock cycle or set of clock cycles. For example, the data latch control processing unit 402c may buffer four commands every clock cycle and output one of the four logic commands every quarter of a clock cycle (e.g., every 20 nanoseconds for an 80 nanosecond clock cycle, or the like). The data latch control processing unit 402c may store predefined command sequences (e.g., YLOG command sequences), in volatile memory 406 or the like.

For example, in one embodiment, the data latch control processing unit 402c may store about 64, 128, 256, or more command sequences, each comprising one or more ordered lists of commands. A command sequence, in various embodiments, may include a single command, multiple commands, up to five commands, up to ten commands, up to thirteen commands, up to fifteen commands, up to twenty commands, more than twenty commands, or the like.

A microcontroller 150 may provide flexible control of values stored in data latches, with the data latch control processing unit 402c storing data in data latches based on command indexes decoded to command sequences, and the flow control processing unit 402a selectively overriding data stored in one or more data latches. For example, the flow control processing unit 402a may initiate the data latch control processing unit 402c to execute a subroutine (e.g., microcode or other computer executable program code) to produce a command sequence (e.g., one or more commands for the memory array 200 and/or for sense amplifiers 250, read/write circuits 230, row decoders 240, or the like), the flow control processing unit 402a may store one or more data values to one or more data latches directly; the flow control processing unit 402a may mask, truncate, change, update, and/or overwrite a command index for the data latch.

In certain embodiments, a read command for a memory array 200 may have a higher priority than a program and/or erase command (e.g., in NAND flash memory, read operations may execute substantially faster than program and/or erase operations, or the like). The microcontroller 150 may switch from executing a program or erase command sequence to a read command sequence in response to receiving an intervening read request, or the like, and switch back to the program or erase command sequence in response to the read instruction sequence finishing. The microcontroller 150 may switch back to the program or erase subroutine where it left off in the program or erase command sequence.

In one embodiment, a microcontroller 150 may include a set of shadow registers that store a status for the microcontroller 150 indicating where the suspend took effect. However, in certain embodiment, to use less power and circuit space than shadow registers, the flow control processing unit 402a may push a register file and pending command sequences for the processing units 402a-d, 404a-n to a thread-switching stack, and may pop the register file and pending command sequences from the thread-switching stack in response to resuming the program or erase operation after an intervening read operation. The processing units 402a-d, 404a-n may begin the interrupted program or read operation where they left off, or may re-execute certain commands in the command sequence to recreate the proper operation state, or the like. Using a thread-switching stack may add fewer registers than using shadow registers for the entire microcontroller 150, while allowing the flow control processing unit 402a and the timing control processing unit 402b to remain synchronized, so that other processing units 402c-d, 404a-n are able to prepare the correct buffer values when the timing control processing unit 402b triggers them, even after resuming an interrupted program or erase operation.

Figure 5:
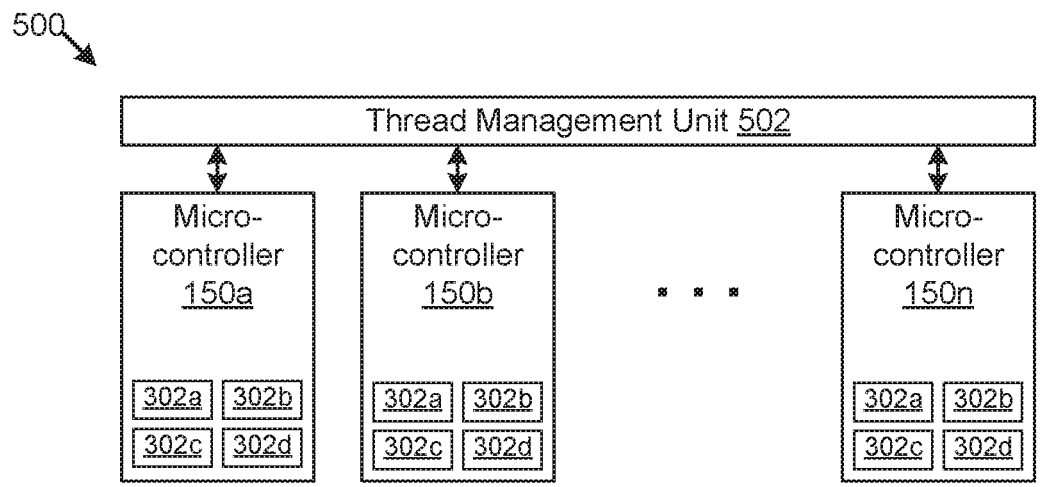
FIG. 5 is a schematic block diagram illustrating one embodiment of a system with multiple on-die memory microcontroller cores.

FIG. 5 depicts one embodiment of a system 500 with multiple on-die memory microcontroller cores 150a-n, synchronized and/or managed by a thread management unit 502. In the depicted embodiment, each of the microcontroller cores 150a-n have a similar size (e.g., may have similar processing units 302a-302d, a similar number of processing units 302a-302d, or the like).

Each microcontroller core 150a-n, in certain embodiments, may be associated with a different subset of memory media 122 (e.g., one or more different die, die planes, blocks, erase blocks, or the like), each capable of performing program, read, and/or erase operations on the associated subsets of memory media 122. In a further embodiment, different microcontroller cores 150a-n may be configured to perform program, read, and/or erase operations on any selected subset of memory media 122 (e.g., one or more different die, die planes, blocks, erase blocks, or the like).

Figure 6:
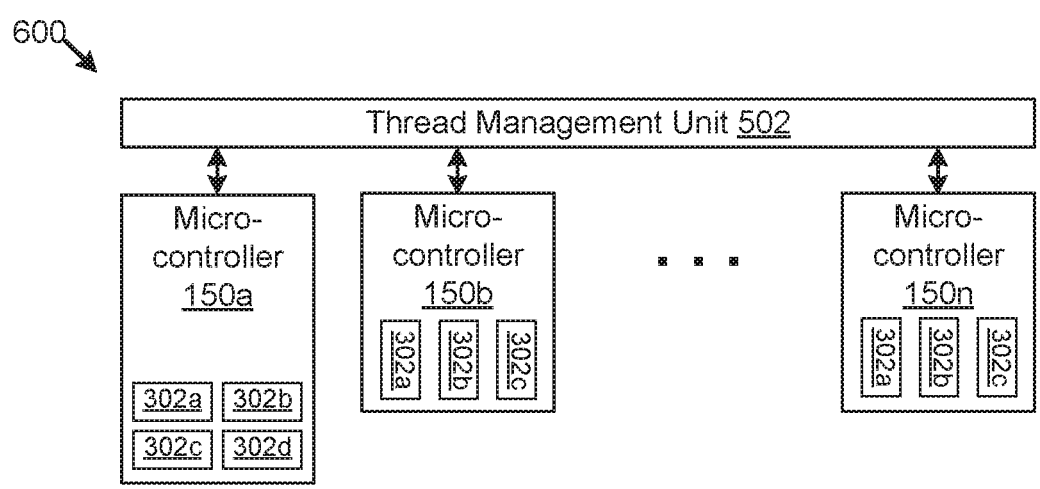
FIG. 6 is a schematic block diagram illustrating another embodiment of a system with multiple on-die memory microcontroller cores.

FIG. 6 depicts another embodiment of a system 600 with multiple on-die memory microcontroller cores 150a-n and a thread management unit 502. In the depicted embodiment, one microcontroller core 150a has a larger size than one or more additional microcontroller cores 150b-n (e.g., the microcontroller core 150a may have more and/or larger processing units 302a-302d than the one or more additional microcontroller cores 150b-n with fewer and/or smaller processing units 302a-c, or the like).

Multiple full size microcontroller cores 150a-n, each with full capabilities, as depicted in FIG. 5, may consume a larger amount of power and/or circuit area of an integrated circuit device 123. In FIG. 6, the system 600 includes one or more full size microcontroller cores 150a, and one or more reduced size and/or partial microcontroller cores 150b-n (e.g., to conserver power, to reduce circuit size, or the like). For example, in the depicted embodiment, for purposes of illustration only, a first, full size microcontroller core 150a comprises four processing units 302a-d, while one or more partial and/or reduced size microcontroller cores 150b-n comprise three processing units 302a-c (e.g., less than the fill size controller core 150a).

The one or more partial and/or reduced size microcontroller cores 150b-n may have had unnecessary registers, rarely used instructions, pointer stacks, register file entries, or the like removed to reduce the size. Partial and/or reduced size microcontroller cores 150b-n, in certain embodiments, may be capable of executing all user mode operations, a predefined set of user mode operations, or the like but may be smaller than a full size, complete microprocessor core 150a. A full size, complete microcontroller 150a may be capable of executing both user mode operations and built-in self-test test mode operations.

For example, a full size, complete microcontroller 150a may comprise a flow control processing unit 402a comprising a built-in self-test processing unit, while the partial and/or reduced size microcontroller cores 150b-n may comprise flow control processing units 402a without built-in self-test processing units. In a further embodiment, a full size, complete microcontroller 150a may comprise a flow control processing unit 402a comprising both a read processing unit and a program/write processing unit, while the partial and/or reduced size microcontroller cores 150b-n may comprise flow control processing units 402a with read processing units but without program/write processing units.

The full size, complete microcontroller 150a may perform one or more operations (e.g., program operations, erase operations, built-in self-test test operations, or the like) for each different subset of memory media 122 of an integrated circuit device 123 (e.g., one or more different die, die planes, blocks, erase blocks, or the like), since the one or more partial and/or reduced size microcontroller cores 150b-n may not support the one or more operations. In certain embodiments, for operations that each of the microcontroller cores 150a-n support (e.g., read operations), the different microcontroller cores 150a-n may be assigned to different subsets of memory media 122 of an integrated circuit device 123 (e.g., one or more different die, die planes, blocks, erase blocks, or the like).

For example, in one embodiment, a die of an integrated circuit device 123 may comprise multiple die planes (e.g., four die planes), each with separate memory arrays 200 capable of performing memory operations in parallel. Die planes may be disposed in the same level (e.g., one or more layers of semiconductors, metal or other conductors, insulators, or the like) of an integrated circuit device 123 as each other (e.g., adjacent in the same level), or parallel in different offset levels, or the like.

Each die plane, in one embodiment, may be assigned a different microcontroller core 150a-n for operations supported by each of the microcontroller cores 150a-n (e.g., read operations), while a single microcontroller core 150a (e.g., a full size, complete microcontroller core 150a) may perform one or more operations that are not supported by each of the microcontroller cores 150a-n for each die plane (e.g., program operations, erase operations, built-in self-test test operations, or the like). For example, in an embodiment with four die planes, one full size microcontroller core 150a capable of performing program operations for each of the four die planes, and three additional reduced size microcontroller cores 150b-n, with all four microcontroller cores 150a-n assigned to different die planes for performing read operations, up to four read operations may be performed in parallel, or three read operations and a program operation, or the like.

In this manner, in certain embodiments, high priority operations (e.g., read operations or the like) may be performed in parallel on multiple memory die or other regions of memory, while still minimizing power consumption and circuit size. Performing only a single program and/or erase operation at a time, in certain embodiments, may be optimal for power management, due to the peak power used for program and/or erase operations, while read operations may use less power.

The one or more smaller, reduced size microcontroller cores 150b-n, in one embodiment, may each include a timing control processing unit 402b. In certain embodiments, a flow control processing unit 402a for the one or more smaller, reduced size microcontroller cores 150b-n may be smaller (e.g., reduced, removed, with a smaller instruction set, with enough logic to perform a read operation but not a program operation, or the like) than in the larger, full size microcontroller core 150a.

In a further embodiment, the one or more smaller, reduced size microcontroller cores 150b-n may have no flow control processing unit 402a, but a portion of the logic and/or functionality of the flow control processing unit 402a may be combined with a timing control processing unit 402b, or the like. Multiple smaller, reduced size microcontroller cores 150b-n, in one embodiment, may share a single data latch control processing unit 402c, or the like. In certain embodiments, both full size microcontroller cores 150a and reduced size microcontroller cores 150b-n may share the same firmware code, but may execute different subroutines, or the like. Volatile memory buffers 406, in one embodiment, may be reduced in size, shared, eliminated, or the like to reduce circuit size in one or more reduced size microcontroller cores 150b-n.

In certain embodiments, it may be beneficial for each microcontroller core 150a-n to include individual timing control processing units 402b, so that each channel, die plane, or other subset of memory media 122 of an integrated circuit device 123 may receive continuous, individual, timing control. In a further embodiment, each microcontroller core 150a-n may include individual flow control processing units 402a, because thread switching among different microcontroller cores 150a-n may be detrimental to performance, due to the increased synchronization between the different microcontroller cores 150a-n and the frequent switching. Reduced version of a flow control processing unit 402a and/or a timing control processing unit 402b (e.g., to handle read operations but not program operations, or the like), may have reduced instruction sets, reduced volatile memory 406, or the like.

The thread management unit (TMU) 502, in certain embodiments, distributes commands to different microcontroller cores 150a-n (e.g., commands for different channels, die planes, and/or other subsets of memory media 122 of an integrated circuit device 123, or the like). For example, the thread management unit 502 may receive commands from a device controller 126 (e.g., read commands, write/program commands, erase commands, test commands, or the like), and select a microcontroller core 150a-n (e.g., based on an address or other indicator of the command, based on which microcontrollers 150a-n are available and/or busy, or the like). The thread management unit 502 may report a status of a command back to the device controller 126 (e.g., in response to a microcontroller completing a command, a busy status during execution of a command, or the like).

The thread management unit 502, in various embodiments, may allocate shared resources between microcontroller cores 150a-n (e.g., external processing units 404a-n, shared volatile memory 406, or the like), may manage power for the microcontroller cores 150a-n (e.g., waking and/or sleeping different microcontroller cores 150a-n to manage power, or the like), manage contention and/or collisions between microcontroller cores 150a-n, and/or otherwise coordinate between the different microcontroller cores 150a-n.

In certain embodiments, the thread management unit 502 dispatch commands from each flow control processing unit 402a of the different microcontroller cores 150a-n to a target timing control processing unit 402b, allowing communication, shared tasks, transferred tasks, or the like between a flow control processing unit 402a of one microcontroller core 150a-n and a timing control processing unit 402b of a different microcontroller core 150a-n.

For example, a flow control processing unit 402a for a larger, full size microcontroller 150a may manage program operations for each die plane or other subset of memory media 122 of an integrated circuit device 123, while timing control processing units 402b of the microcontroller cores 150a-n may be dedicated to different die planes or other subsets of memory media 122 (e.g., to simplify placement and routing of conductor lines, or the like), and the thread management unit 502 may send, commands, tasks, or the like from the flow control processing unit 402a to the other timing control processing units 402b, for program operations, to link commands from the flow control processing unit 402a to the right channels (e.g., die planes) for the program operations.

The thread management unit 502, in certain embodiments, may use an assignment table and a multiplexer, to route operations, commands, and/or tasks from the flow control processing unit 402a of the full size microcontroller 150a to the timing control processing unit 402b associated with the channel for the program operation, and to route tasks from the other flow control processing units 402a (e.g., of the reduced size microcontrollers 150b-n) to the timing control processing units 402b associated with their respective channels.

FIG. 7 is a schematic block diagram illustrating one embodiment of an integrated circuit device 700 with an on-die memory microcontroller 150. In the depicted embodiment, a memory array 200 (e.g., one or more die planes, or the like) is in one level of the integrated circuit device 700 (e.g., one or more layers of conductors, insulators, semiconductors, or the like) and the microcontroller 150 and other circuitry 704 (e.g., sense amplifiers, word line switches, or the like) are in a different level of the integrated circuit device 700 (e.g., under the array 200), and are in communication with the memory array 200 through one or more interconnections 702 (e.g., insulating layers, conductive layers, through silicon vias, holes, buses, or the like). In the depicted embodiment, the memory array 200 is in a first level of the integrated circuit device 700, and the microcontroller 150 is in a second level of the integrated circuit device 700 that is parallel to and offset from the first level. A substrate 706 comprises a third level of the integrated circuit device 700 (e.g., a support structure on which one or more other layers are formed and/or deposited), and is parallel to and offset from the other layers.

Figure 8:
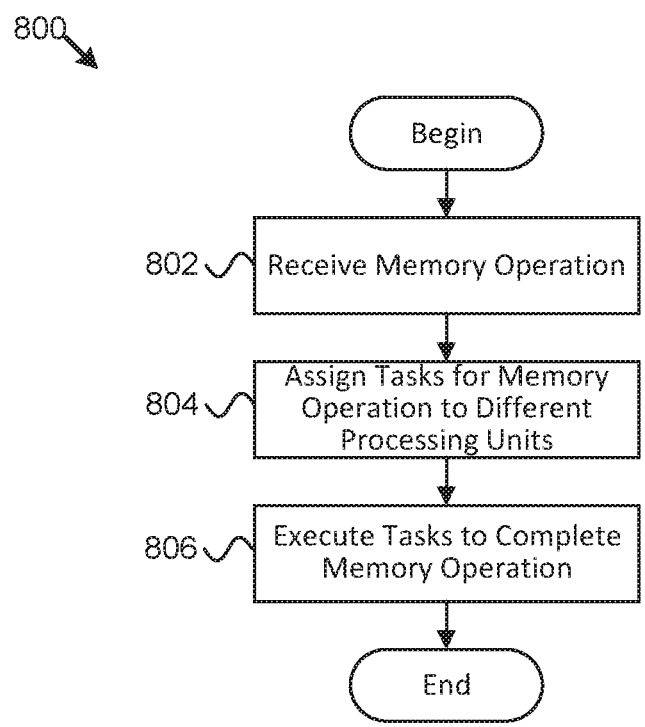
FIG. 8 is a schematic flow chart diagram illustrating one embodiment of a method for an on-die memory microcontroller.

FIG. 8 is a schematic flow chart diagram illustrating one embodiment of a method 800 for an on-die memory microcontroller 150. The method 800 begins, and a microcontroller 150 receives 802 a request for a memory operation (e.g., a read request, a write/program request, an erase request, or the like) for a memory array 200 of an integrated circuit device 123.

A flow control processing unit 402a and/or a thread management unit 502 assigns 804 tasks for the received 802 request for the memory operation to different processing units 302a-n, 402a-d, 404a-n. One or more processing units 302a-n, 402a-d, 404a-n execute 806 the assigned tasks 804 to complete the memory operation and the method 800 ends.

Figure 9:
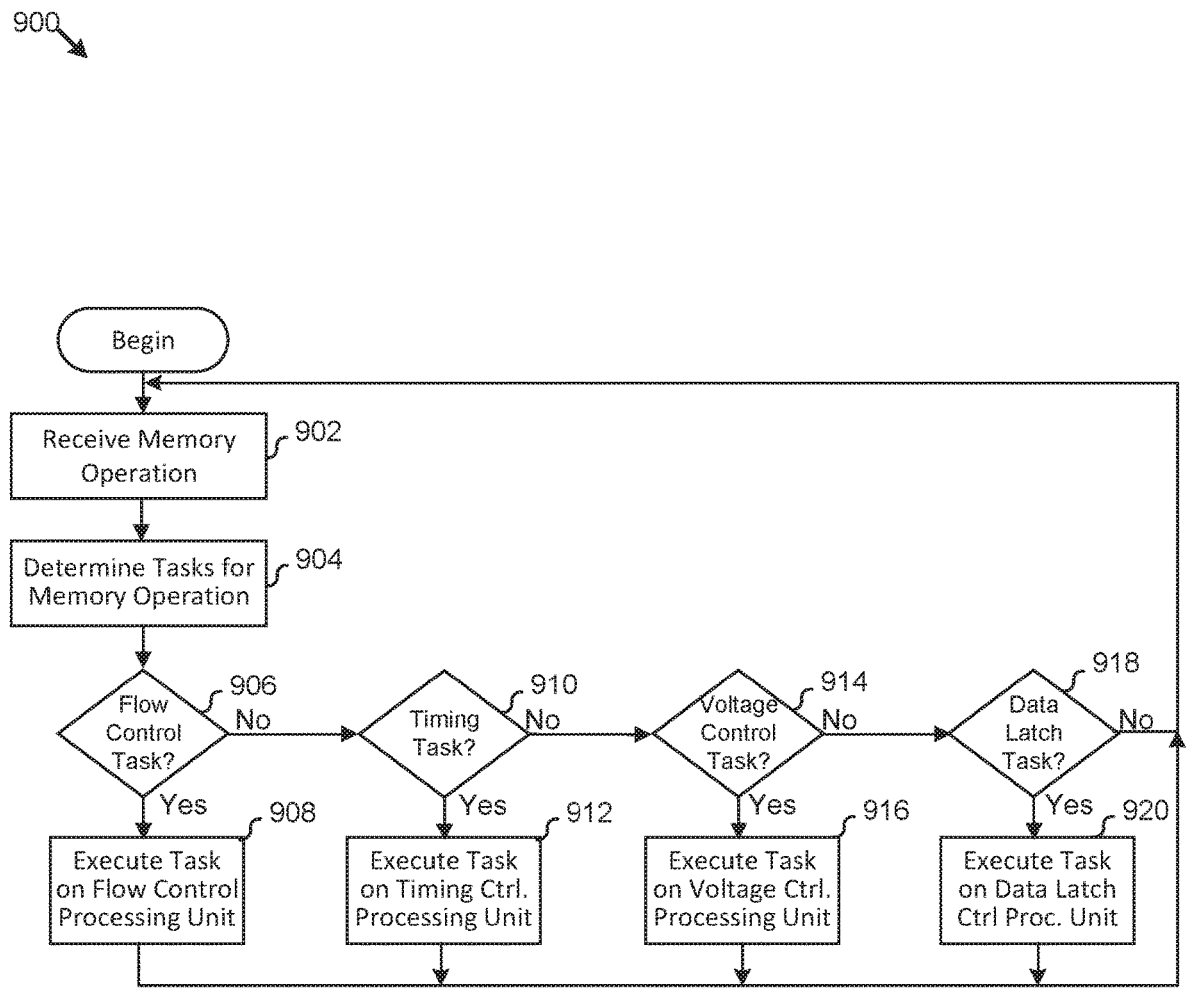
FIG. 9 is a schematic flow chart diagram illustrating a further embodiment of a method for an on-die memory microcontroller.

FIG. 9 is a schematic flow chart diagram illustrating one embodiment of a method 900 for an on-die memory microcontroller 150. The method 900 begins, and a microcontroller 150 receives 902 a request for a memory operation (e.g., a read request, a write/program request, an erase request, or the like) for a memory array 200 of an integrated circuit device 123.

A flow control processing unit 402a and/or a thread management unit 502 determines 904 tasks for the received 902 request for the memory operation. The flow control processing unit 402a and/or the thread management unit 502 determines 906 whether there are any flow control tasks, and the flow control processing unit 402a executes 908 the determined 906 flow control tasks. The flow control processing unit 402a and/or the thread management unit 502 determines 910 whether there are any timing control tasks, and a timing control processing unit 402b executes 912 the determined 910 timing control tasks. The flow control processing unit 402a and/or the thread management unit 502 determines 914 whether there are any voltage control tasks, and the voltage control processing unit 402d executes 916 the determined 914 voltage control tasks. The flow control processing unit 402a and/or the thread management unit 502 determines 918 whether there are any data latch control tasks, and the data latch control processing unit 402c executes 920 the determined 918 data latch control tasks. The method 900 continues, and the microcontroller 150 receives 902 one or more additional requests for memory operations.

Means for storing data, in various embodiments, may include a memory device 120, a memory medium 122, a memory element 123, a memory array 200, a volatile memory medium 122 (e.g., RAM, DRAM, SDRAM, DDR SDRAM, SRAM, T-RAM, Z-RAM, or the like), a non-volatile memory medium 122 (e.g., ReRAM, Memristor memory, programmable metallization cell memory, PCM, PCME, PRAM, PCRAM, ovonic unified memory, C-RAM, NAND flash memory, 2D NAND flash memory, 3D NAND flash memory, NOR flash memory, nano RAM or NRAM, nanocrystal wire-based memory, silicon-oxide based sub-10 nanometer process memory, graphene memory, SONOS memory, PMC memory, CBRAM, MRAM, magnetic storage media such as a hard disk or tape drive, optical storage media, SCM, or the like), or the like. Other embodiments may include similar or equivalent means for storing data.

Means for sorting tasks by category of task, in various embodiments, may include a microcontroller 150, a flow control processing unit 402a, a thread management unit 502, a data latch control processing unit 402c, an integrated circuit device 123, and/or other logic hardware or computer executable code stored on a computer readable storage medium. Other embodiments may include similar or equivalent means for sorting tasks by category of task.

Means for performing different categories of tasks in parallel, in various embodiments, may include a microcontroller 150, a flow control processing unit 402a, a timing control processing unit 402b, a data latch control processing unit 402c, a voltage control processing unit 402d, an external processing unit 404a-n, another processing unit 302a-n, 402a-d, 404a-n, an integrated circuit device 123, and/or other logic hardware or computer executable code stored on a computer readable storage medium. Other embodiments may include similar or equivalent means for performing different categories of tasks in parallel.

Means for performing fewer categories of tasks using a different set of processing units, in various embodiments, may include a microcontroller 150, a flow control processing unit 402a, a timing control processing unit 402b, a data latch control processing unit 402c, a voltage control processing unit 402d, an external processing unit 404a-n, another processing unit 302a-n, 402a-d, 404a-n, an integrated circuit device 123, and/or other logic hardware or computer executable code stored on a computer readable storage medium. Other embodiments may include similar or equivalent means for performing fewer categories of tasks using a different set of processing units.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   non-volatile memory cells in an integrated circuit device;
   a plurality of microcontroller units in the integrated circuit device, the plurality of microcontroller units comprising a first set of one or more microcontroller units configured to perform program operations and read operations on the non-volatile memory cells and a second set of one or more microcontroller units configured to perform read operations but not program operations on the non-volatile memory cells;
   a management unit configured to instruct the first set of the one or more microcontroller units and the second set of the one or more microcontroller units to perform read operations on different subsets of the non-volatile memory cells in parallel; and
   each microcontroller unit comprising a plurality of processing units, different processing units for a respective microcontroller unit performing different categories of tasks in parallel for the respective microcontroller unit for a respective subset of the non-volatile memory cells.

2. The apparatus of claim 1, wherein the second set of the one or more microcontroller units comprise fewer processing units than the first set of the one or more microcontroller units and perform fewer categories of tasks.

3. The apparatus of claim 2, wherein the plurality of processing units of the first set of the one or more microcontroller units comprise a built-in self-test unit configured to perform a plurality of test operations on the non-volatile memory cells and the fewer processing units of the second set of the one or more microcontroller units have no built-in self-test unit.

4. The apparatus of claim 1, wherein the first set of the one or more microcontroller units are configured to perform the program operations on each subset of the non-volatile memory cells and each microcontroller unit in the second set of the one or more microcontroller units is configured to perform read operations on a different subset of the non-volatile memory cells.

5. The apparatus of claim 1, wherein the non-volatile memory cells are in a first level of the integrated circuit device and the first set of the one or more microcontroller units is in a second level of the integrated circuit device, the second level being parallel to and offset from the first level.

6. The apparatus of claim 1, wherein a clock rate for the first set of the one or more microcontroller units is set lower than a clock rate at which a microcontroller in the first set can perform data operations on the non-volatile memory cells with a single processing unit without increasing a latency of the data operations, the plurality of processing units of the first set of the one or more microcontroller units a configured to perform data operations in parallel on the non-volatile memory cells at the set clock rate without increasing a latency of the data operations.

7. The apparatus of claim 1, wherein the plurality of processing units of the first set of the one or more microcontroller units support different instruction sets associated with the different categories of tasks.

8. The apparatus of claim 1, wherein the plurality of processing units of the first set of the one or more microcontroller units comprise one or more of a flow control processing unit, a timing control processing unit, a voltage control processing unit, and a data latch control processing unit.

9. The apparatus of claim 1, wherein the different categories of tasks comprise one or more of flow control tasks, timing control tasks, data latch control tasks, voltage control tasks, and built-in self-test tasks.

10. The apparatus of claim 1, further comprising volatile memory of the integrated circuit device, the plurality of processing units of the first set of the one or more microcontroller units storing data in the volatile memory to perform the different categories of tasks, wherein a built-in self-test unit of the plurality of processing units of the first set of the one or more microcontroller units stores test data read from the non-volatile memory cells into a portion of the volatile memory, the portion of the volatile memory otherwise used by other processing units of the plurality of processing units of the first set of the one or more microcontroller units when not in a test mode of the built-in self-test unit.

11. A system comprising:
a memory die comprising a plurality of die planes each die plane comprising non-volatile memory cells, the memory die further comprising a microcontroller, and one or more additional microcontrollers, wherein there are at least as many microcontrollers on the memory die as die planes;
the microcontroller comprising a plurality of processing units for performing tasks for the plurality of die planes;
the one or more additional microcontrollers comprising fewer processing units than the microcontroller; and
a management unit configured to instruct the microcontroller and the one or more additional microcontrollers to perform a set of memory operations on the plurality of die planes in parallel, wherein each microcontroller controls memory operations from the set on a different die plane.

12. The system of claim 11, wherein different processing units of the plurality of processing units perform different types of tasks in parallel for the non-volatile memory cells and the one or more additional microcontrollers perform fewer types of tasks than the microcontroller.

13. The system of claim 11, wherein the non-volatile memory cells are disposed in a first level of the memory die and the microcontroller and the one or more additional microcontrollers are disposed in a second level of the memory die, the second level parallel to and offset from the first level.

14. The system of claim 11, wherein the plurality of processing units of the microcontroller comprise a built-in self-test unit configured to perform a plurality of test operations on the non-volatile memory cells and the fewer processing units of the one or more additional microcontrollers have no built-in self-test unit.

15. The system of claim 11, wherein:
the plurality of processing units of the microcontroller are configured to perform program operations and read operations on the non-volatile memory cells and the fewer processing units of the one or more additional microcontrollers are configured to perform read operations and not program operations on the non-volatile memory cells; and
the management unit is configured to instruct the microcontroller and the one or more additional microcontrollers to perform read operations on the plurality of die planes in parallel.

16. The system of claim 15, wherein the microcontroller is configured to perform the program operations on each die plane.

17. An apparatus comprising:
a plurality of planes of non-volatile memory cells on a memory die;
first means for executing instructions on the memory die to store data to or read data from memory cells in a selected plane of the non-volatile memory cells;
second means for executing instructions on the memory die to read data from but not store data to memory cells in a selected plane; and
third means for instructing the first means and the second means to read data from the plurality of planes in parallel.

18. The apparatus of claim 17, wherein:
the first means for executing instructions on the memory die to store data to or read data from memory cells in a selected plane comprises means for performing different categories of tasks in parallel; and
the second means for executing instructions on the memory die to read data from but not store data to memory cells in a selected plane comprises means for performing fewer categories of tasks than the first means for executing instructions on the memory die to store data to or read data from memory cells in a selected plane.

19. The apparatus of claim 17, wherein the first means for executing instructions on the memory die to store data to or read data from memory cells in a selected plane is disposed in a first level of the memory die and the non-volatile memory cells are disposed in a second level of the memory die, the second level parallel to and offset from the first level.

20. An apparatus comprising:
a microcontroller for a memory array of an integrated circuit device, the microcontroller configured to:
perform program operations for the memory array;
perform read operations for the memory array;
perform test operations for the memory array;
select a plurality of tasks for a memory operation for the memory array using a first processing unit;
control timing of the plurality of tasks for the memory operation using a second processing unit; and
set voltages for the plurality of tasks for the memory operation using a third processing unit;
one or more additional microcontrollers of the integrated circuit device, the one or more additional microcontrollers are configured to perform read operations for the memory array but not program operations or test operations for the memory array; and
a thread management unit of the of the integrated circuit device configured to distribute read commands from a device controller to the microcontroller and to the one or more additional microcontrollers, wherein the microcontroller and the one or more additional microcontrollers perform the read commands on different subsets of the memory array in parallel.

21. The apparatus of claim 20, wherein the one or more additional microcontrollers comprise fewer processing units than the microcontroller.

22. A method comprising:
assigning a program operation for non-volatile memory cells on a selected die plane of a plurality of die planes on a memory die to a microcontroller core that supports both program operations and read operations; and
assigning read operations to be performed in parallel in the plurality of die planes to a plurality of microcontroller cores, each microcontroller core of the plurality of microcontroller cores assigned to read non-volatile memory cells on a different die plane of the plurality of die planes, the plurality of microcontroller cores include the microcontroller core that supports both program operations and read operations and one or more additional microcontroller cores that supports read operations but do not support program operations.

23. The system of claim 15, wherein:
the management unit is further configured to instruct the microcontroller to perform a program operation on a first die plane of the plurality of die planes while the one or more additional microcontrollers perform read operations on remaining die planes of the plurality of die planes.

* * * * *